(12) United States Patent
Yao et al.

(10) Patent No.: US 6,936,530 B1
(45) Date of Patent: Aug. 30, 2005

(54) DEPOSITION METHOD FOR SI-GE EPI LAYER ON DIFFERENT INTERMEDIATE SUBSTRATES

(75) Inventors: Liang-Gi Yao, Hsin-Chu (TW); Kuen-Chyr Lee, Hsin-Chu (TW); Shih-Chang Chen, Hsin-Chu (TW); Mong-Song Liang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/772,939

(22) Filed: Feb. 5, 2004

(51) Int. Cl.[7] .................. H01L 21/28; H01L 21/3205
(52) U.S. Cl. .................................. 438/602; 438/918
(58) Field of Search ......................... 438/285, 286, 438/312, 365, 602, 604, 614, 918

(56) References Cited

U.S. PATENT DOCUMENTS

| | | | |
|---|---|---|---|
| 4,357,183 A | * | 11/1982 | Fan et al. ..................... 117/8 |
| 5,273,930 A | | 12/1993 | Steele et al. ................. 437/89 |
| 5,513,593 A | * | 5/1996 | Hansson et al. ............. 117/56 |
| 5,620,907 A | | 4/1997 | Jalali-Farahani et al. ... 438/320 |
| 5,976,941 A | | 11/1999 | Boles et al. ................. 438/349 |
| 6,388,307 B1 | | 5/2002 | Kondo et al. ................ 257/592 |

* cited by examiner

Primary Examiner—Phuc T. Dang
(74) Attorney, Agent, or Firm—Haynes and Boone, LLP

(57) ABSTRACT

A method of forming an Si—Ge epitaxial layer comprising the following steps. A structure is provided and a doped Si—Ge seed layer is formed thereover. The doped Si—Ge seed layer having increased nucleation sites. A Si—Ge epitaxial layer upon the doped Si—Ge seed layer whereby the Si—Ge epitaxial layer lacks discontinuity.

31 Claims, 1 Drawing Sheet

DEPOSITION METHOD FOR SI-GE EPI LAYER ON DIFFERENT INTERMEDIATE SUBSTRATES

FIELD OF THE INVENTION

The present invention relates generally to semiconductor fabrication and more specifically to semiconductor transistor fabrication.

BACKGROUND OF THE INVENTION

Silicon-germanium epitaxial (Si—Ge epi) technology is becoming the mainstream in the application of heterojunction bipolar transistors. Si—Ge epi layers are used as the base material in such transistors in BiCMOS applications where bi-polar (BI) and complementary metal-oxide semiconductor (CMOS) transistors are fabricated in different areas of the same wafer. The Si—Ge epi layer could provide higher emitter injection efficiency and lower base transit time.

However, the discontinuity of the Si—Ge epi layer occurs on different intermediate layers and becomes a major issue for subsequent process steps due to poor polysilicon (poly) sheet resistance connected with the base electrode.

U.S. Pat. No. 6,388,307 B1 to Kondo et al. describes a B-doped SiGe layer in a transistor process.

U.S. Pat. No. 5,976,941 to Boles et al. describes a SiGe epi process.

U.S. Pat. No. 5,273,930 to Steele et al. describes a SiGe epi process on a silicon seed layer.

U.S. Pat. No. 5,620,907 to Jalali-Farahani et al. describes a method for a heterojunction bipolar transistor.

SUMMARY OF THE INVENTION

Accordingly, it is an object of one or more embodiments of the present invention to provide a method of fabricating semiconductor transistors utilizing Si—Ge epi layers.

Other objects will appear hereinafter.

It has now been discovered that the above and other objects of the present invention may be accomplished in the following manner. Specifically, a structure is provided and a doped Si—Ge seed layer is formed thereover. The doped Si—Ge seed layer having increased nucleation sites. A Si—Ge epitaxial layer upon the doped Si—Ge seed layer whereby the Si—Ge epitaxial layer lacks discontinuity.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Figure 1:
FIGS. 1 to 3 schematically illustrates a preferred embodiment of the present invention.

Initial Structure—FIG. 1

As shown in FIG. 1, structure 10 has a seed layer 12 formed thereover. Structure 10 is preferably an intermediate substrate and may be a silicon substrate and is understood to possibly include a semiconductor wafer or substrate, active and passive devices formed within the wafer, conductive layers and dielectric layers (e.g., inter-poly oxide (IPO), intermetal dielectric (IMD), etc.) formed over the wafer surface. The term "semiconductor structure" is meant to include devices formed within a semiconductor wafer and the layers overlying the wafer. Structure 10 may also include silicon oxide and/or polysilicon.

Seed layer 12 is preferably a doped Si—Ge layer having a thickness of preferably from about 10 to 400 Å and more preferably from about 20 to 200 Å. Doped Si—Ge seed layer 12 is preferably doped with boron (B), C, P or As and is more preferably doped with boron (B).

When doping with boron, $B_2H_6$ is introduced during the formation of Si—Ge seed layer 12 at a rate of preferably from about 0 to 100 sccm and more preferably from about 0 to 50 sccm under the following conditions:

- temperature: preferably from about 500 to 750° C. and more preferably from about 600 to 700° C.;
- pressure: preferably from about 20 to 200 Torr and more preferably from about 50 to 150 Torr; and
- time: preferably from about 10 to 120 seconds and more preferably from about 10 to 60 seconds.

The dopant within doped Si—Ge seed layer 12 preferably has a concentration of from about 1E18 to 1E20 atoms/cm$^2$ and more preferably about 1E19 cm$^2$.

The addition of a dopant to the Si—Ge forms the doped Si—Ge seed layer 12 permitting much better step coverage and eliminates discontinuity by, the inventors believe, increasing the nucleation sites.

Figure 2:
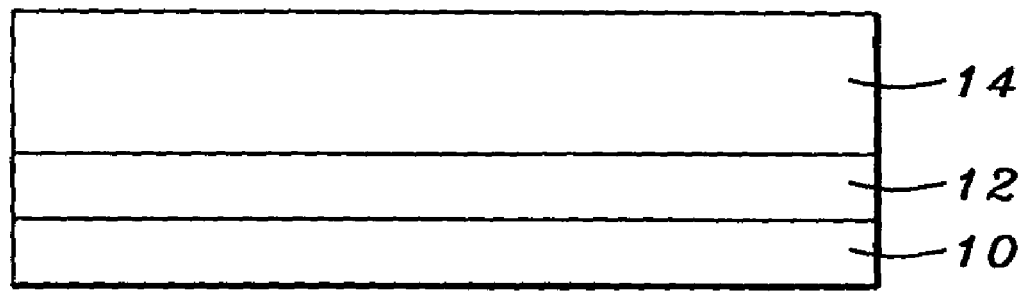

Formation of Si—Ge Epitaxial Layer 14—FIG. 2

As shown in FIG. 2, a Si—Ge epitaxial (epi) layer 14 is formed upon the doped Si—Ge seed layer 12 to a thickness of preferably from about 100 to 700 Å and more preferably from about 200 to 500 Å. Si—Ge epi layer 14 is formed under the following conditions:

- Si precursor: preferably $SiH_4$, $SiH_2Cl_2$, $SiHCl_3$ or $SiCl_4$ and more preferably $SiH_4$;
- Ge precursor: preferably $GeH_4$ or $GeCl_4$ and more preferably $GeH_4$;
- temperature: preferably from about 500 to 750° C. and more preferably from about 600 to 700° C.;
- pressure: preferably from about 20 to 200 Torr and more preferably from about 50 to 150 Torr; and
- time: preferably from about 20 to 400 seconds and more preferably from about 100 to 300 seconds.

The epi layer 14 could have Si—Ge epi film with graded or box Ge profile. The epi film 14 might also have other doping concentrations.

Figure 3:
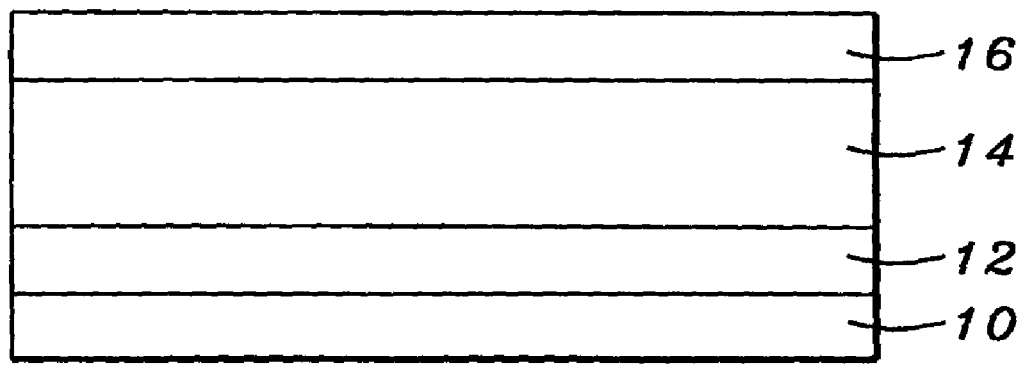

Formation of Optional Cap Layer 16—FIG. 3

As shown in FIG. 3, a cap layer 16 may be optionally formed over the Si—Ge epitaxial layer 14 to a thickness of preferably from about 20 to 200 Å and more preferably from about 40 to 120 Å to finish the base process in a BiCMOS process flow.

Due to the doped Si—Ge seed layer, the discontinuity issue is eliminated.

Cap layer 16 is preferably comprised of silicon.

ADVANTAGES OF THE PRESENT INVENTION

The advantages of one or more embodiments of the present invention include:

1. shorten the incubation time of seed layer;
2. improve film uniformity on different substrates; and
3. improve epi quality.

While particular embodiments of the present invention have been illustrated and described, it is not intended to limit the invention, except as defined by the following claims.

We claim:

1. A method of forming an Si—Ge epitaxial layer, comprising the steps of:
   providing a structure;
   forming a doped Si—Ge seed layer over the structure; the doped Si—Ge seed layer having increased nucleation sites; and
   forming the Si—Ge epitaxial layer upon the doped Si—Ge seed layer; whereby the Si—Ge epitaxial layer lacks discontinuity.

2. The method of claim 1, wherein the structure is an intermediate substrate.

3. The method of claim 1, wherein the structure includes silicon oxide and/or polysilicon.

4. The method of claim 1, wherein the structure is a silicon substrate.

5. The method of claim 1, wherein the doped Si—Ge seed layer has a thickness of from about 10 to 400 Å.

6. The method of claim 1, wherein the doped Si—Ge seed layer has a thickness of from about 20 to 200 Å.

7. The method of claim 1, wherein the doped Si—Ge seed layer is doped with boron, C, P or As.

8. The method of claim 1, wherein the doped Si—Ge seed layer is doped with a dopant to a concentration of from about 1E18 to 1E20 atoms/cm$^2$.

9. The method of claim 1, wherein the doped Si—Ge seed layer is doped with a dopant to a concentration of about 1E19 atoms/cm$^2$.

10. The method of claim 1, wherein the doped Si—Ge seed layer is doped with boron to a concentration of from about 1E18 to 1E20 atoms/cm$^2$.

11. The method of claim 1, wherein the doped Si—Ge seed layer is doped with boron to a concentration of about 1E19 to 1E20 atoms/cm$^2$.

12. The method of claim 1, wherein the Si—Ge epitaxial layer has a thickness of from about 100 to 700 Å.

13. The method of claim 1, wherein the doped Si—Ge seed layer is doped with boron using $B_2H_6$.

14. The method of claim 1, wherein the doped Si—Ge seed layer is doped with boron using $B_2H_6$ under the following conditions:
   $B_2H_6$: from about 0 to 100 sccm;
   temperature: from about 500 to 750° C.;
   pressure: from about 20 to 200 Torr; and
   time: from about 10 to 120 seconds.

15. The method of claim 1, wherein the doped Si—Ge seed layer is doped with boron using $B_2H_6$ under the following conditions:
   $B_2H_6$: from about 0 to 50 sccm;
   temperature: from about 600 to 700° C.;
   pressure: from about 50 to 150 Torr; and
   time: from about 10 to 60 seconds.

16. The method of claim 1, wherein the Si—Ge epitaxial layer is formed under the following conditions:
   Si precursor: $SiH_4$, $SiH_2Cl_2$, $SiHCl_3$ or $SiCl_4$;
   Ge precursor: $GeH_4$ or $GeCl_4$;
   temperature: from about 500 to 750° C.;
   pressure: from about 20 to 200 Torr; and
   time: from about 20 to 400 seconds.

17. The method of claim 1, wherein the Si—Ge epitaxial layer is formed under the following conditions:
   Si precursor: $SiH_4$;
   Ge precursor: $GeH_4$;
   temperature: from about 600 to 700° C.;
   pressure: from about 50 to 150 Torr; and
   time: from about 100 to 300 seconds.

18. The method of claim 1, including the step of forming a cap layer over the Si—Ge epitaxial layer.

19. The method of claim 1, including the step of forming a cap layer over the Si—Ge epitaxial layer; the cap layer having a thickness of from about 20 to 200 Å.

20. The method of claim 19, the cap layer being formed of silicon.

21. A Si—Ge epitaxial layer structure, comprising:
   an intermediate substrate;
   a doped Si—Ge seed layer over the intermediate substrate; the doped Si—Ge seed layer having increased nucleation sites; and
   a Si—Ge epitaxial layer upon the doped Si—Ge seed layer to form the Si—Ge epitaxial layer structure; whereby the Si—Ge epitaxial layer lacks discontinuity.

22. The structure of claim 21, wherein the intermediate substrate includes silicon oxide and/or polysilicon.

23. The structure of claim 21, wherein the intermediate substrate is a silicon substrate.

24. The structure of claim 21, wherein the doped Si—Ge seed layer has a thickness of from about 10 to 400 Å.

25. The structure of claim 21, wherein the doped Si—Ge seed layer is doped with boron, C, P or As.

26. The structure of claim 21, wherein the doped Si—Ge seed layer is doped with a dopant to a concentration of from about 1E18 to 1E20 atoms/cm$^2$.

27. The structure of claim 21, wherein the doped Si—Ge seed layer is doped with boron to a concentration of from about 1E18 to 1E20 atoms/cm$^2$.

28. The structure of claim 21, wherein the Si—Ge epitaxial layer has a thickness of from about 100 to 700 Å.

29. The structure of claim 21, wherein the doped Si—Ge seed layer is doped with boron using $B_2H_6$.

30. The structure of claim 21, including a cap layer over the Si—Ge epitaxial layer.

31. The structure of claim 21, including a cap layer over the Si—Ge epitaxial layer; the cap layer having a thickness of from about 20 to 200 Å.

* * * * *